United States Patent
Chen et al.

[11] Patent Number: 6,063,664
[45] Date of Patent: May 16, 2000

[54] METHOD OF MAKING EEPROM WITH TRENCHED STRUCTURE

[75] Inventors: Jong Chen, Taipei; Chrong Jung Lin, Hsin-Tien; Di-Son Kuo, Hsinchu, all of Taiwan

[73] Assignee: Taiwan Semiconductor Manufacturing Company, Hsin-Chu, Taiwan

[21] Appl. No.: 09/049,215

[22] Filed: Mar. 27, 1998

[51] Int. Cl.$^7$ ................................................ H01L 21/8247
[52] U.S. Cl. ............................ 438/259; 438/270; 438/589
[58] Field of Search .................................. 438/259, 264, 438/270, 589, 593, 594

[56] References Cited

U.S. PATENT DOCUMENTS

| | | | |
|---|---|---|---|
| 4,222,062 | 9/1980 | Trotter et al. | 357/45 |
| 4,835,741 | 5/1989 | Baglee | 365/185 |
| 5,045,490 | 9/1991 | Esquivel et al. | 437/43 |
| 5,180,680 | 1/1993 | Yang | 438/259 |
| 5,429,970 | 7/1995 | Hong | 438/259 |
| 5,480,820 | 1/1996 | Roth et al. | 437/43 |
| 5,598,367 | 1/1997 | Noble | 365/149 |

*Primary Examiner*—Chandra Chaudhari
*Attorney, Agent, or Firm*—George O. Saile; Stephen B. Ackerman; Rosemary L. S. Pike

[57] ABSTRACT

A new method of forming a trenched floating gate in the fabrication of a EEPROM memory cell is described. A trench is etched into a semiconductor substrate. Ions are implanted into the surface of the semiconductor substrate and into the semiconductor substrate surrounding the trench to form N+ regions. A gate oxide layer is grown over the surface of the semiconductor substrate and within the trench. The gate oxide within a tunneling window overlying one of the N+ regions is removed and a tunnel oxide is grown in the tunneling window. A polysilicon layer is deposited over the surface of the semiconductor substrate and within the trench and patterned to form a floating gate within the trench and on the surface of the substrate wherein the floating gate contacts the N+ region through the tunneling window.

13 Claims, 6 Drawing Sheets

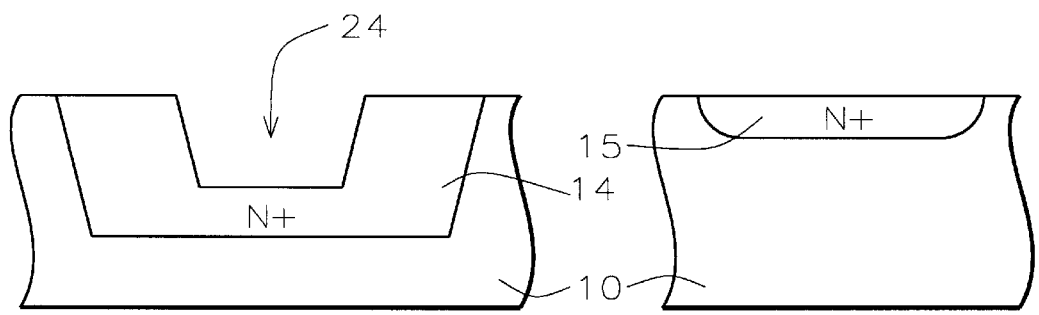
*FIG. 6A*   *FIG. 6B*
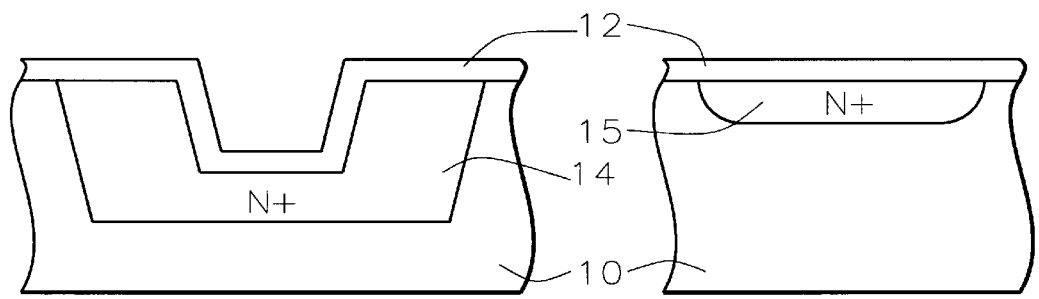
*FIG. 7A*   *FIG. 7B*
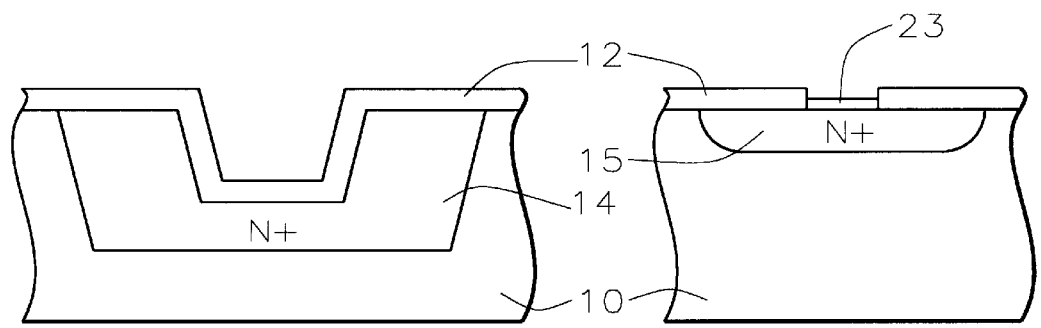
*FIG. 8A*   *FIG. 8B*

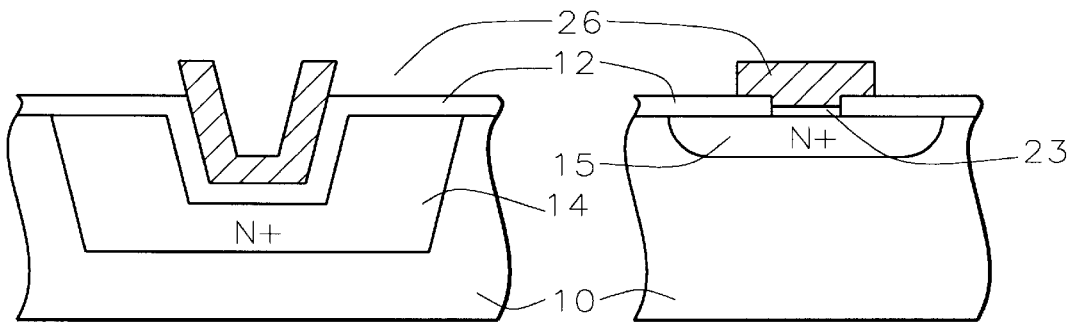
*FIG. 9A*    *FIG. 9B*
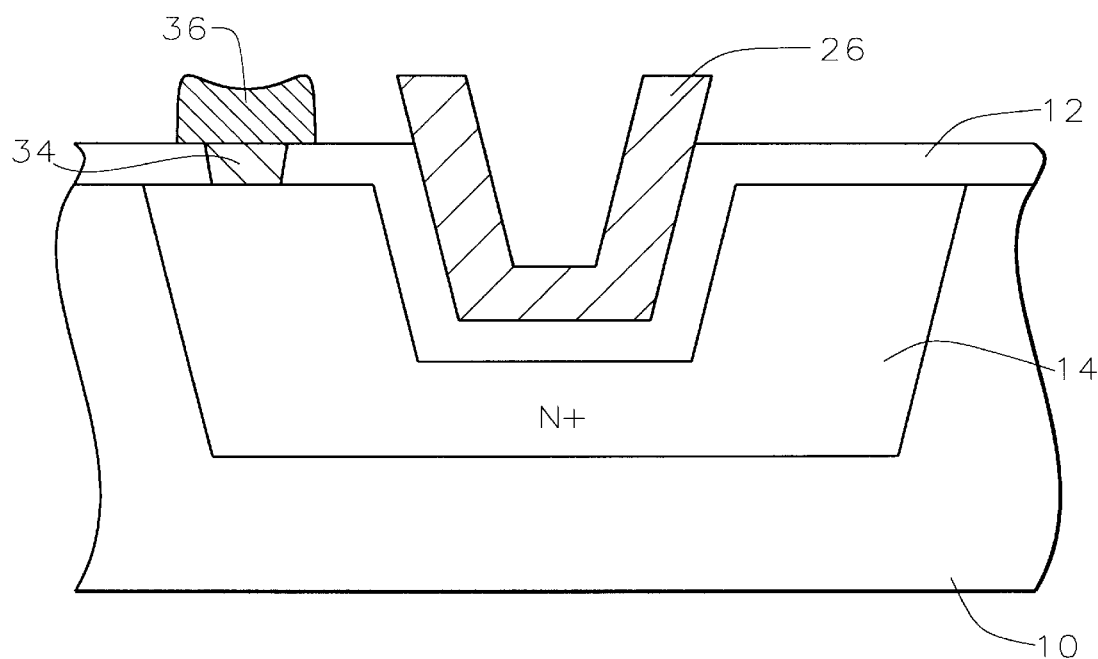
*FIG. 10*

METHOD OF MAKING EEPROM WITH TRENCHED STRUCTURE

BACKGROUND OF THE INVENTION (1) Field of the Invention

The invention relates to a method of fabricating semiconductor memory devices employing floating gates, and more particularly, to a method of fabricating memory devices employing trenched floating gates.

(2) Description of the Prior Art

One class of semiconductor memory devices employs floating gates; that is, gates which are completely surrounded by an insulating layer, such as a silicon oxide. The presence or absence of charge in the floating gates represents binary information. These are called electrically programmable read only memories (EPROM). EEPROMS are erasable electrically programmable read only memories. A tunneling oxide, necessary for the erase function of the cell, is situated below the floating gate of the memory cell. A large coupling ratio is required to drive electrons through the tunneling oxide. That is, the capacitance between the control gate and the floating gate must be large relative to the capacitance between the floating gate and the channel. In order to achieve a large enough coupling ratio, the floating gate must occupy a large area on the silicon surface.

FIG. 1 illustrates a conventional surface structure floating gate. A thin gate oxide 12 is formed on the surface of a semiconductor substrate 10. N+ regions 14 have been implanted into the semiconductor substrate. A control gate 20 is formed through an opening in the thin oxide layer to contact the N+ region 14. Floating gate 25 is capacitively coupled to the N+ region 14 through the thin gate oxide 12.

It is desired to reduce the surface area of the floating gate in order to fit more devices on the chip. A number of workers in the field have sought to reduce surface area through trenched floating gates of various types. U.S. Pat. No. 5,480,820 to Roth et al shows a floating gate within a trench adjacent to control electrodes alongside the trench. U.S. Pat. No. 5,045,490 to Esquivel et al and U.S. Pat. No. 4,835,741 to Baglee teach a floating gate formed within a trench and a control gate formed within the floating gate. U.S. Pat. No. 5,598,367 to Noble teaches a floating gate within a trench similar to a trenched DRAM cell. U.S. Pat. No. 4,222,062 to Trotter et al discloses a floating gate within a V-shaped trench. U.S. Pat. No. 5,135,879 to Richardson teaches a floating gate formed on the sidewall of a trench.

SUMMARY OF THE INVENTION

A principal object of the present invention is to provide an effective and very manufacturable method of fabricating an EEPROM integrated circuit device.

Another object of the present invention is to provide an effective and very manufacturable method of fabricating a trenched floating gate in the fabrication of a EEPROM memory cell.

In accordance with the objects of this invention a new method of forming a trenched floating gate in the fabrication of a EEPROM memory cell is achieved. A trench is etched into a semiconductor substrate. Ions are implanted into the surface of the semiconductor substrate and into the semiconductor substrate surrounding the trench to form N+ regions. A gate oxide layer is grown over the surface of the semiconductor substrate and within the trench. The gate oxide within a tunneling window overlying one of the N+ regions is removed and a tunnel oxide is grown in the tunneling window. A polysilicon layer is deposited over the surface of the semiconductor substrate and within the trench and patterned to form a floating gate within the trench and on the surface of the substrate wherein the floating gate contacts the N+region through the tunneling window.

Also, in accordance with the objects of this invention, a memory cell having a trenched floating gate is achieved. The memory cell comprises a floating gate within a trench in a semiconductor substrate and on the surface of the semiconductor substrate. A first N+ region surrounds the trench and is separated from the floating gate by a gate oxide layer. A second N+ region within the semiconductor substrate underlies a surface portion of the floating gate wherein the floating gate is capacitively coupled to the second N+ region through a tunneling oxide lying between the floating gate and the second N+ region. A control gate on the surface of the substrate contacts the first N+ region through an opening in the gate oxide layer.

BRIEF DESCRIPTION OF THE DRAWINGS

In the accompanying drawings forming a material part of this description, there is shown:

FIGS. 6A and 6B through 9A and 9B and 10 schematically illustrate in cross-sectional representation the process of fabricating a preferred embodiment of the present invention.

DESCRIPTION OF THE PREFERRED EMBODIMENTS

Figure 1:
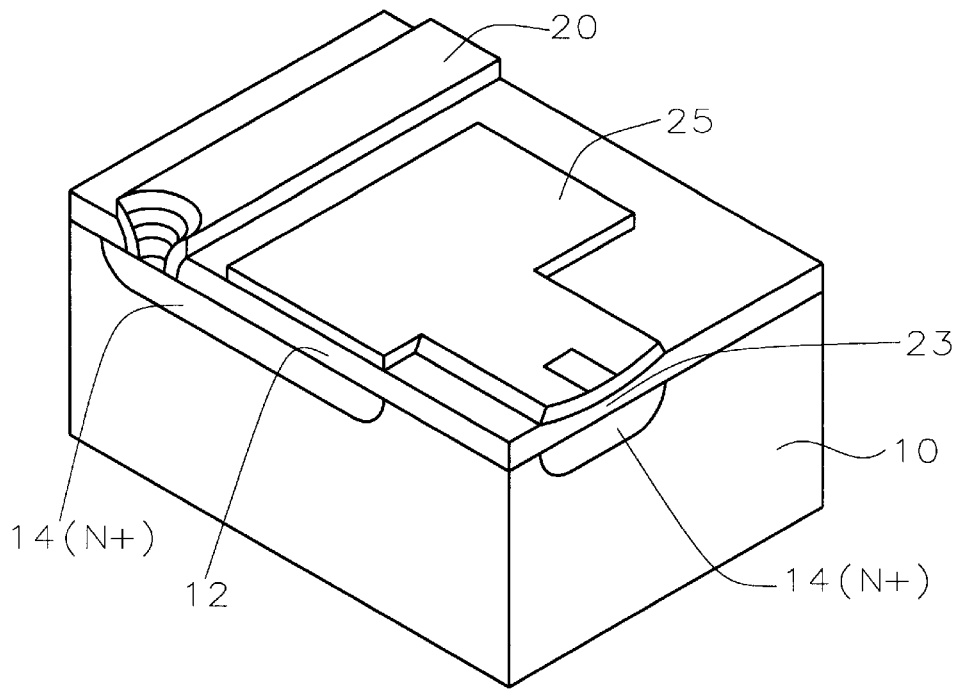
FIG. 1 schematically illustrates in cross-sectional representation a surface floating gate of the prior art.
Figure 2:
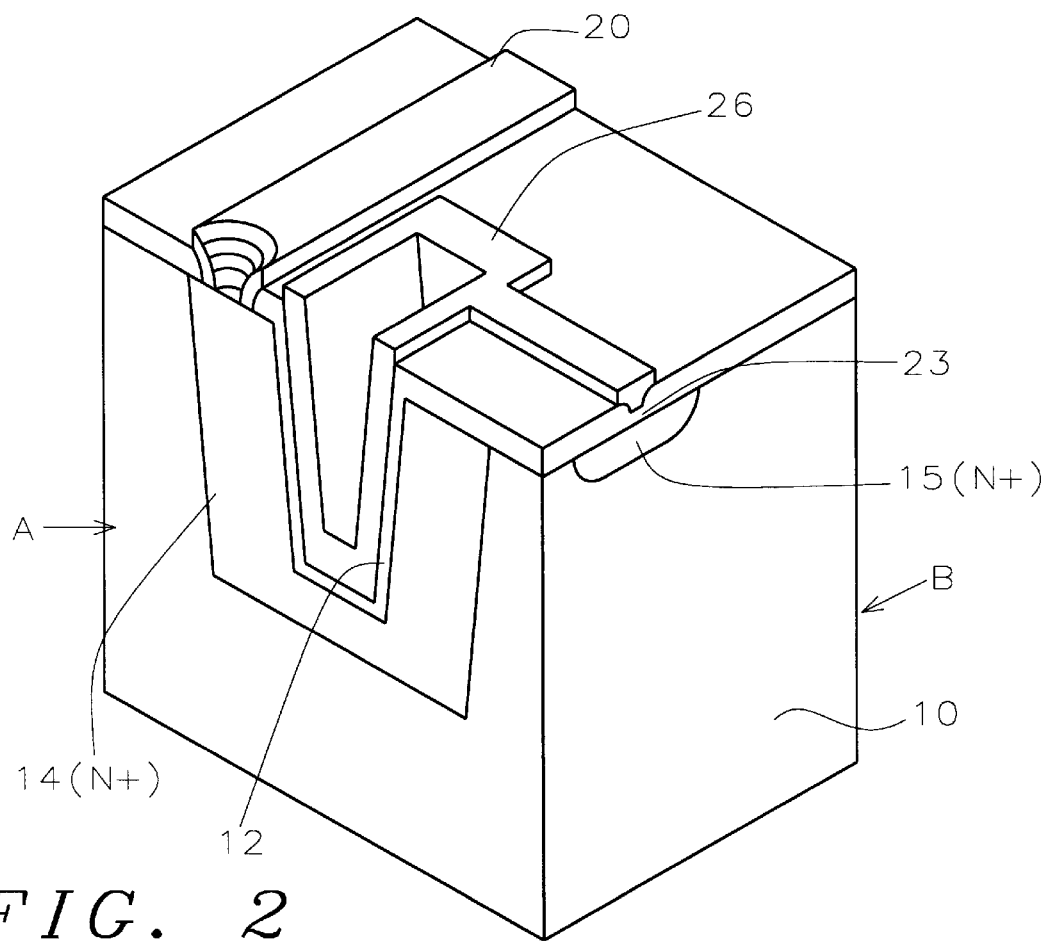
FIGS. 2 through 5 schematically illustrate in cross-sectional representation preferred embodiments of the present invention.

FIG. 2 illustrates a trenched floating gate of the present invention. A trench has been etched into the semiconductor substrate 10. A thin gate oxide 12 is formed on the surface of the semiconductor substrate 10 and within the trench. N+regions 14 and 15 have been implanted into the semiconductor substrate and surrounding the trench. A control gate 20 is formed through an opening in the thin oxide layer to contact the N+ region 14. Floating gate 26 within the trench is capacitively coupled to the N+ region 15 through the thin gate oxide 12.

Figure 3:
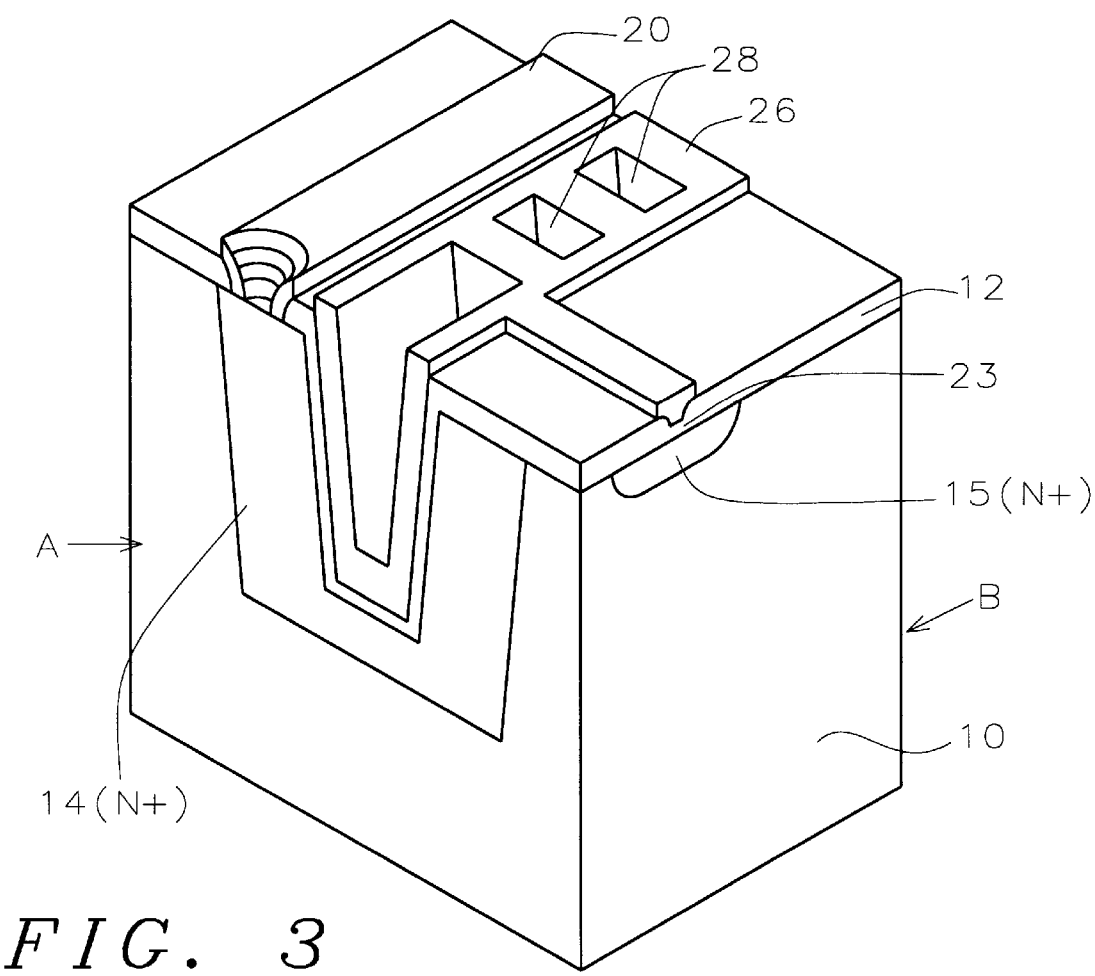
Figure 4:
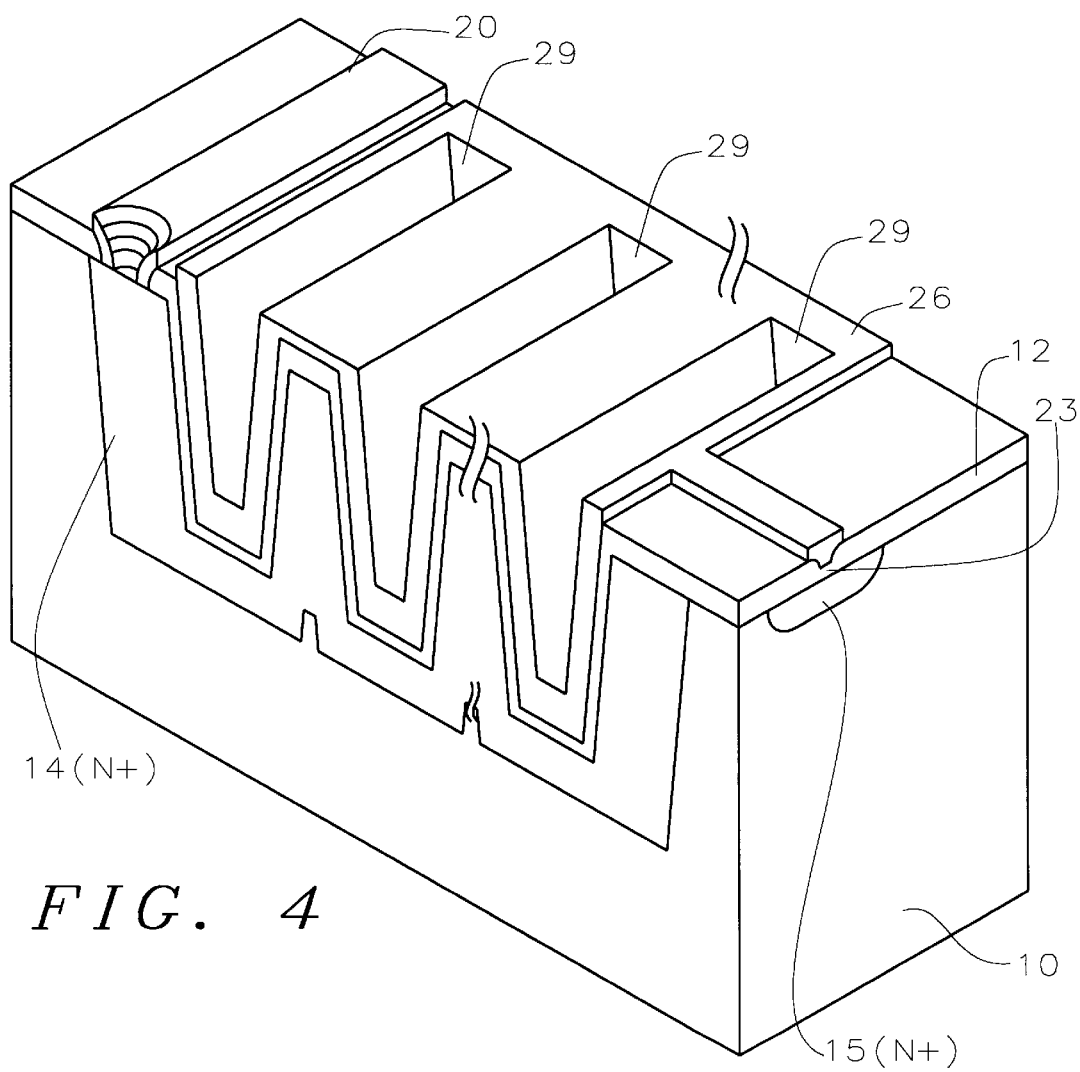
Figure 5:
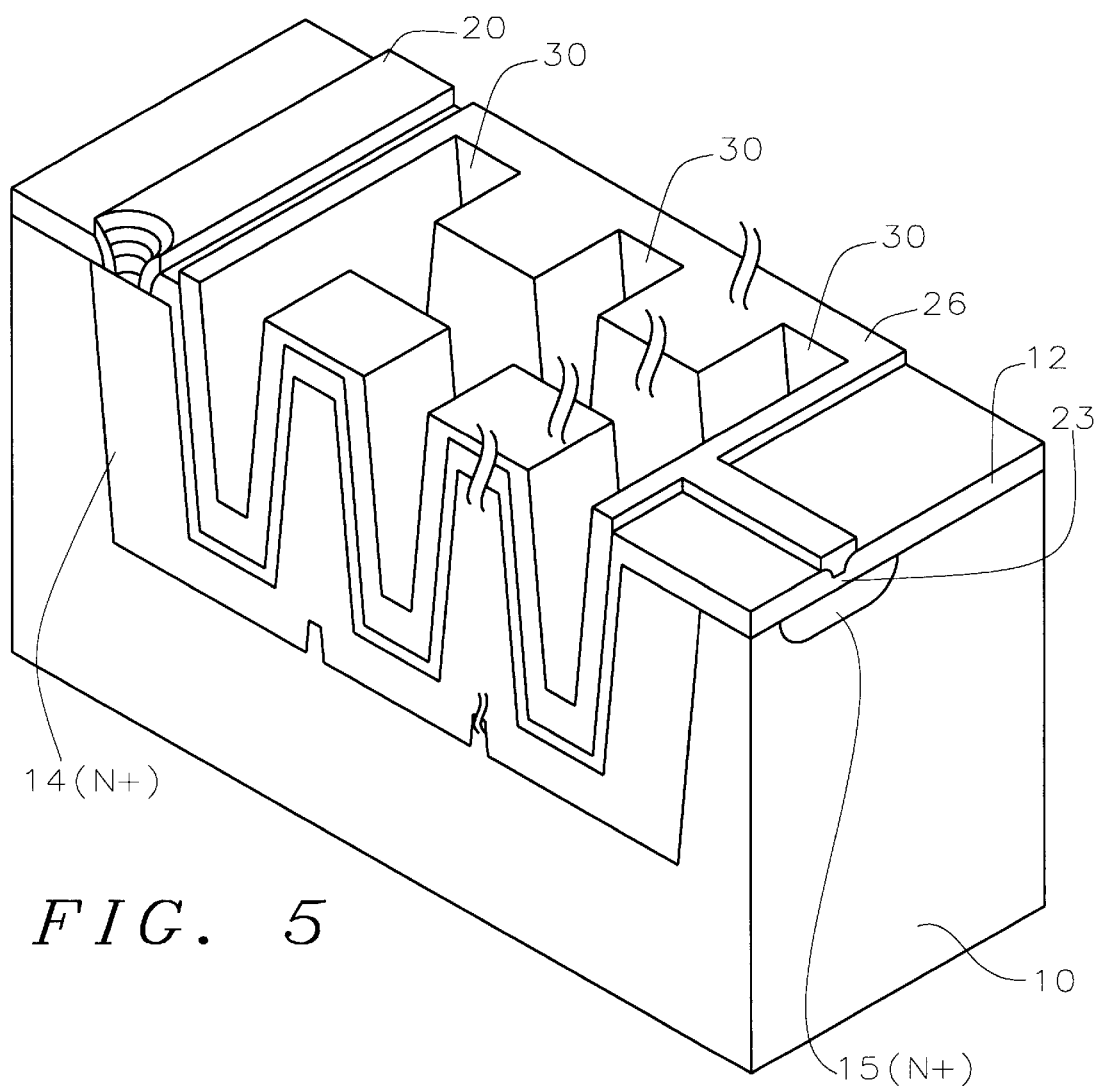

FIGS. 3 through 5 illustrate ot her possible embodiments of the trenched floating gate of the present invention. The floating gate can be made with a multiple trench structure. For example, FIG. 3 illustrates a row of trenches 28. FIG. 4 illustrates a one-dimensional array of trenches 29. FIG. 5 illustrates a two-dimensional array of trenches 30. Other trenched structures may also be used in the process of the invention.

Referring now to FIGS. 6 through 10, the process of forming a trenched floating gate will be described. A floating gate of the first type shown in FIG. 2 will be illustrated. However, it will be understood by those skilled in the art that any of the trenched floating gate structures shown in FIGS. 3–5 or other structures not shown can be made in a similar manner. FIGS. 6A–9A illustrate face A of FIG. 2 in which a cross section of a trench is shown. FIGS. 6B–9B illustrate face B of FIG. 2 in which the tunneling window of the floating gate is shown.

Referring now more particularly to FIGS. 6A and 6B, semiconductor substrate 10 is illustrated. This is preferably a monocrystalline silicon substrate. A trench 24 is etched into the semiconductor substrate 10, as shown in FIG. 6A. The trench may have a depth of between about 0.3 to 0.5 microns. This is a conservative range that is easy to make. If possible, the trench is preferably deeper. As noted above, multiple trenches as shown in FIGS. 3–5 may be etched into the substrate. The simple case illustrated in FIG. 2 is discussed here.

Next, an ion implant is performed to form the N+ implanted regions around the trench as shown by 14 in FIG. 6A and in the tunneling window as shown by 15 in FIG. 6B. The ion implant is preferably a large angle tilt ion implant (LATID), using a energy relatively higher than the conventional energy level.

Referring now to FIGS. 7A and 7B, a thermal gate oxide 12 is grown on the surface of the substrate and within the trench to a thickness of between about 100 and 300 Angstroms.

A mask is used to define the tunnel oxide regions and the thermal oxide is completely removed within the tunneling window. A tunnel oxide 23 is grown in the tunneling window where the thermal oxide has been removed. The tunnel oxide is grown to a thickness of between about 50 and 200 Angstroms. This is illustrated in FIG. 8B.

Referring now to FIGS. 9A and 9B, a layer of polysilicon is deposited over the surface of the substrate and within the trench to a conventional thickness of between about 500 and 3000 Angstroms and patterned to form the floating gate 26.

A contact window is now etched through the gate oxide layer 12 to the N+ region 14. The control gate is formed within the contact window; for example by depositing a tungsten plug 34 and depositing and patterning an aluminum layer 36, such as AlSiCu. The control gate 20 is illustrated in FIG. 10.

The process of the present invention provides a trenched floating gate which greatly reduces the surface area of the floating gate and thereby increases the packing density of the integrated circuit. Also, from the point of view of manufacturing, the process of the present invention is much easier than some of the stacked floating gate structures. Without the stacked structure, the process of the invention is totally comparable with that of a logic device; that is, a single polysilicon layer. Therefore, the process of forming the floating gate and control gate of the memory cell will be comparable with the process for forming the gate electrodes in the logic part of the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of forming a trenched floating gate in the fabrication of a memory cell comprising:

etching a trench into a semiconductor substrate;

implanting ions into the surface of said semiconductor substrate and into said semiconductor substrate surrounding said trench to form N+ regions;

growing a gate oxide layer over the surface of said semiconductor substrate and within said trench;

removing said gate oxide within a tunneling window overlying one of said N+ regions;

growing a tunnel oxide in said tunneling window;

depositing a polysilicon layer over the surface of said semiconductor substrate and within said trench and patterning said polysilicon layer to form a floating gate within said trench wherein said floating gate is capacitively coupled to said N+ region within said tunneling window;

opening a contact window in said gate oxide layer to contact one of said N+ regions surrounding said trench; and depositing a conducting layer within said contact window and patterning said conducting layer to form a control gate to complete formation of said trenched floating gate in the fabrication of said memory cell.

2. The method according to claim 1 wherein said trench has a depth of between about 0.3 and 0.5 microns.

3. The method according to claim 1 wherein said gate oxide layer has a thickness of between about 100 and 300 Angstroms.

4. The method according to claim 1 wherein said tunnel oxide layer has a thickness of between about 50 and 200 Angstroms.

5. The method according to claim 1 wherein said conducting layer comprises a tungsten plug and an aluminum overlayer.

6. The method according to claim 1 wherein said conducting layer comprises a metal layer.

7. The method according to claim 1 wherein multiple trenches are etched into said semiconductor substrate and wherein said polysilicon layer forming said floating gate fills said multiple trenches.

8. A method of forming a trenched floating gate in the fabrication of a memory cell comprising:

etching multiple trenches into a semiconductor substrate;

implanting ions into the surface of said semiconductor substrate and into said semiconductor substrate surrounding said trenches to form N+ regions;

growing a gate oxide layer over the surface of said semiconductor substrate and within said trenches;

removing said gate oxide layer within a tunneling window overlying one of said N+ regions;

growing a tunnel oxide in said tunneling window;

depositing a polysilicon layer over the surface of said semiconductor substrate and within said trenches and patterning said polysilicon layer to form a floating gate within said trenches wherein said floating gate is capacitively coupled with said N+region within said tunneling window;

opening a contact window in said gate oxide layer to contact one of said N+regions surrounding said trenches; and depositing a conducting layer within said contact window and patterning said conducting layer to form a control gate to complete formation of said trenched floating gate in the fabrication of said memory cell.

9. The method according to claim 8 wherein said trench has a depth of between about 0.3 and 0.5 microns.

10. The method according to claim 8 wherein said gate oxide layer has a thickness of between about 100 and 300 Angstroms.

11. The method according to claim 8 wherein said tunnel oxide layer has a thickness of between about 50 and 200 Angstroms.

12. The method according to claim 8 wherein said conducting layer comprises a tungsten plug and an aluminum overlayer.

13. The method according to claim 8 wherein said conducting layer comprises a metal layer.

* * * * *